US012641906B2

(12) United States Patent
Huang et al.

(10) Patent No.: US 12,641,906 B2
(45) Date of Patent: May 26, 2026

(54) TAPERED BACKSIDE GROUND STRUCTURE FOR PIXEL ARRAY

(71) Applicant: Taiwan Semiconductor Manufacturing Company, Ltd., Hsinchu (TW)

(72) Inventors: Yu-Wei Huang, Tainan City (TW); Chen-Hsien Lin, Tainan City (TW); Shyh-Fann Ting, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 577 days.

(21) Appl. No.: 18/150,400

(22) Filed: Jan. 5, 2023

(65) Prior Publication Data

US 2024/0194716 A1 Jun. 13, 2024

Related U.S. Application Data

(60) Provisional application No. 63/431,066, filed on Dec. 8, 2022.

(51) Int. Cl.
H10F 39/00 (2025.01)
H10F 39/18 (2025.01)

(52) U.S. Cl.
CPC ......... H10F 39/811 (2025.01); H10F 39/014 (2025.01); H10F 39/024 (2025.01); H10F 39/182 (2025.01); H10F 39/8053 (2025.01); H10F 39/8063 (2025.01)

(58) Field of Classification Search
CPC .................. H10F 39/199; H10F 39/811–813
See application file for complete search history.

(56) References Cited

U.S. PATENT DOCUMENTS

| | | | | |
|---|---|---|---|---|
| 5,389,474 A | * | 2/1995 | Iguchi | ........................ G03F 1/29 |
| | | | | 430/311 |
| 9,564,577 B1 | * | 2/2017 | Hsu | ........................ H10N 50/10 |
| 2010/0244175 A1 | | 9/2010 | Park | |
| 2015/0333093 A1 | * | 11/2015 | Ting | .................... H10F 39/8057 |
| | | | | 438/66 |

(Continued)

FOREIGN PATENT DOCUMENTS

CN 108695173 A 10/2018

OTHER PUBLICATIONS

Karabacak et al. "Enhanced step coverage by oblique angle physical vapor deposition" Journal of Applied Physics 97, 124504 (2005), published on Jun. 20, 2005.

*Primary Examiner* — Christine S. Kim
*Assistant Examiner* — Cole Leon Lindsey
(74) *Attorney, Agent, or Firm* — Eschweiler & Potashnik, LLC

(57) ABSTRACT

Some embodiments relate to an integrated chip including a semiconductor substrate and a pixel array comprising a plurality of photodetectors in the semiconductor substrate. The pixel array further comprises a plurality of transistors on a frontside of the semiconductor substrate. A backside ground (BSGD) structure extends into a backside of the semiconductor substrate, opposite the frontside, and further surrounding the pixel array along a periphery of the pixel array. The BSGD structure has a first sloped sidewall extending from a bottom surface of the BSGD structure that is recessed into the semiconductor substrate.

20 Claims, 18 Drawing Sheets

(56)     References Cited

U.S. PATENT DOCUMENTS

| | | | |
|---|---|---|---|
| 2016/0300962 A1* | 10/2016 | Borthakur | ............. H04N 23/10 |
| 2017/0229346 A1* | 8/2017 | Chang | ................ H01L 23/3171 |
| 2018/0240835 A1 | 8/2018 | Wu et al. | |
| 2018/0337203 A1 | 11/2018 | Wu et al. | |
| 2020/0119072 A1 | 4/2020 | Lim | |
| 2020/0135789 A1 | 4/2020 | Cheng et al. | |
| 2021/0225916 A1 | 7/2021 | Hsieh et al. | |
| 2022/0262840 A1 | 8/2022 | Lee et al. | |

* cited by examiner

300a

700

1100

116     106     222 z y ⊙ → x

I / 102     II     II

1500

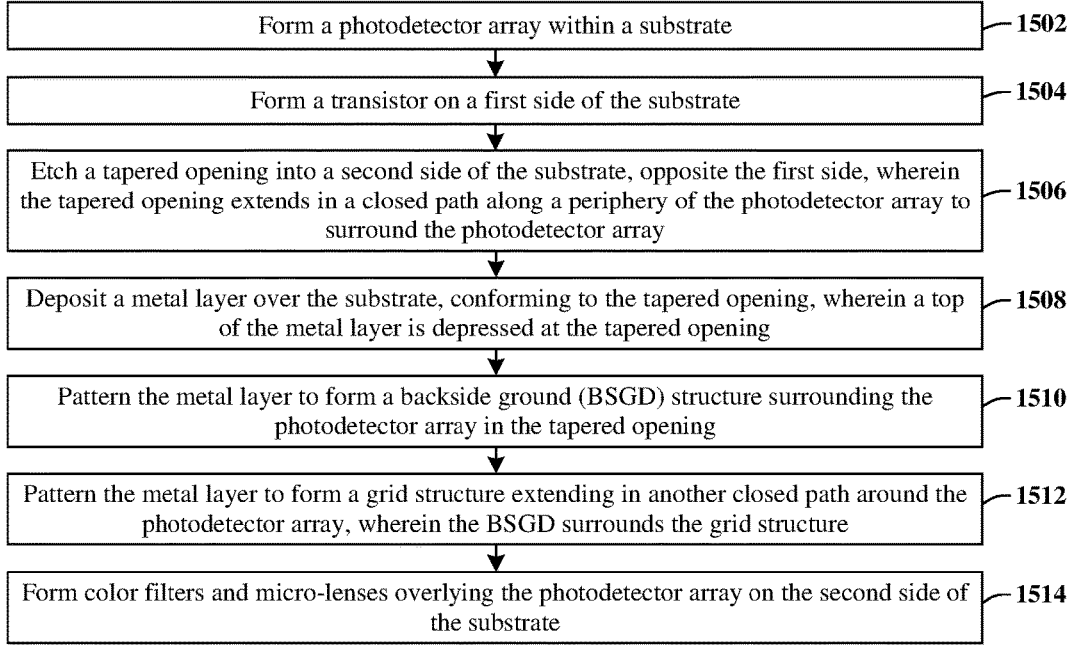

| | |
|---|---|
| Form a photodetector array within a substrate | 1502 |
| Form a transistor on a first side of the substrate | 1504 |
| Etch a tapered opening into a second side of the substrate, opposite the first side, wherein the tapered opening extends in a closed path along a periphery of the photodetector array to surround the photodetector array | 1506 |
| Deposit a metal layer over the substrate, conforming to the tapered opening, wherein a top of the metal layer is depressed at the tapered opening | 1508 |
| Pattern the metal layer to form a backside ground (BSGD) structure surrounding the photodetector array in the tapered opening | 1510 |
| Pattern the metal layer to form a grid structure extending in another closed path around the photodetector array, wherein the BSGD surrounds the grid structure | 1512 |
| Form color filters and micro-lenses overlying the photodetector array on the second side of the substrate | 1514 |

Fig. 15

TAPERED BACKSIDE GROUND STRUCTURE FOR PIXEL ARRAY

REFERENCE TO RELATED APPLICATION

This application claims the benefit of U.S. Provisional Application No. 63/431,066, filed on Dec. 8, 2022, the contents of which are hereby incorporated by reference in their entirety.

BACKGROUND

Many modern day electronic devices contain digital image sensors. Digital image sensors may be backside illumination sensors or frontside illumination sensors. Backside illumination sensors can increase the amount of light captured by the sensor while frontside illumination sensors have a greater response uniformity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15 illustrates a flow diagram of some embodiments of a method for forming an integrated chip comprising a BSGD structure with sloped sidewalls.

DETAILED DESCRIPTION

Figure 1:
FIG. 1 illustrates a cross-sectional view of some embodiments of an integrated chip comprising a backside ground (BSGD) structure with sloped sidewalls.
Figure 1:
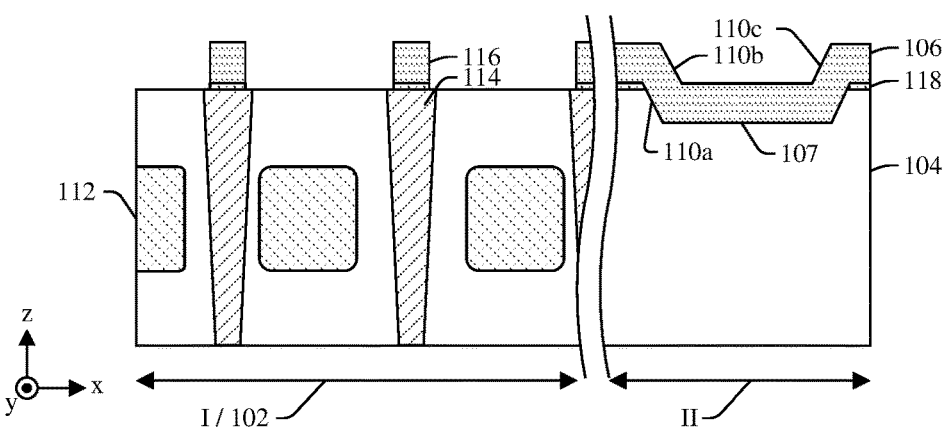

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor may comprise a pixel array, which comprises a plurality of pixels in a plurality of rows and a plurality of columns. The pixels comprise individual photodiodes in a substrate and further comprise individual transistors on a frontside of the substrate. A backside metal grid (BSMG) is on a backside of the substrate, opposite the frontside, and separates color filters of the pixels. Further, a backside ground (BSGD) structure is on the backside and surrounds the pixel array along a periphery of the pixel array.

A process for forming the BSGD structure and BSMG may comprise performing a first etch into the substrate to form an opening, depositing a metal layer lining the substrate and the opening to form the BSGD structure in the opening, depositing an antireflective layer on the metal layer, and performing a second etch into the metal layer and the antireflective layer to form the BSMG. The first etch and/or the second etch introduce charge into the substrate, which may negatively impact performance of the image sensor. The BSGD structure electrically couples the substrate to ground to control or otherwise release unwanted charge that accumulates in the substrate during the first and second etching processes.

The first etch forms the opening with vertical sidewalls. However, forming the opening as such results in the metal layer and the antireflective layer depositing with poor step coverage and conformality at the vertical sidewalls. Hence, seams may extend through the antireflective layer to the BSGD structure at bottom corners of the opening. These seams expose the BSGD structure to an etchant used during the second etch, whereby the BSGD structure may become damaged. Such damage may prevent the BSGD structure from controlling or otherwise releasing unwanted charge in the substrate, whereby image performance may suffer.

To reduce the likelihood of seams, the present disclosure forms the opening with sloped sidewalls instead of vertical sidewalls. The sloped sidewalls lead to enhanced step coverage and, in some embodiments, conformality while depositing the metal layer and the antireflective layer, which reduces the likelihood of the seams. Reducing the likelihood of the seams reduces the likelihood of the second etch damaging the BSGD structure and hence increases manufacturing yields. Further, because of the tapered sidewalls, the BSGD structure is formed with a tapered profile decreasing width towards the substrate.

FIG. 1 illustrates a cross-sectional view 100 of some embodiments of an integrated chip comprising a BSGD structure with sloped sidewalls.

The integrated chip comprises a central region I and a peripheral region II surrounding the central region I (only partially shown). The central region I accommodates a pixel array 102, whereas the peripheral region I surrounds the central region I and may accommodate logic devices, other suitable devices, or no devices.

The pixel array 102 comprises an array of photodetectors 112 in a substrate 104. The photodetectors 112 are in a plurality of rows and a plurality of columns. Further, the photodetectors 112 are separated by a backside deep trench isolation (BDTI) structure 114 and a backside metal grid (BSMG) 116 overlying the BDTI structure 114.

A BSGD structure 106 is in the peripheral region II (partially shown) and extends along a periphery of the pixel array 102 to surround the pixel array 102. The BSGD structure 106 has a first sloped sidewall 110*a* extending from a bottom surface 107 of the BSGD structure 106 that is recessed into the substrate 104.

A top of the BSGD structure 106 is indented towards the substrate 104 and which accommodates a second sloped sidewall 110*b* of the BSGD structure 106 and a third sloped sidewall 110*c* of the BSGD structure 106. The second sloped sidewall 110*b* extends substantially in parallel with the first sloped sidewall 110*a* and faces an opposite direction as the first sloped sidewall 110*a*. The third sloped sidewall 110*c* extends over the BSGD structure 106 on an opposite side of the top indent as the second sloped sidewall 110*b*.

The BDTI structure 114 spaces the BSGD structure 106 from the pixel array 102, and a barrier layer 118 separates the BSGD structure 106 and the BSMG 116 from the substrate 104. The BSGD structure 106 extends through the barrier layer 118 and directly contacts the substrate 104, while the BSMG 116 is spaced from the substrate 104 by the barrier layer 118. In some embodiments, the BSGD structure 106 and the BSMG 116 are integrated in a common metal layer, as described in relation to FIGS. 8 and 9. The BSGD structure 106 and/or the BSMG 116 comprises may, for example, be or comprise tungsten (e.g., W), some other suitable metal(s) and/or conductive material(s), or any combination of the foregoing.

As seen hereafter, because the first sloped sidewall 110*a* is sloped, instead of vertical, a conductive layer from which the BSGD structure 106 is formed deposits with improved step coverage and, in some embodiments, thickness uniformity at the first sloped sidewall 110*a*. Further, an antireflective layer protecting the BSGD structure 106 during formation of the BSMG 116 deposits with improved step coverage and, in some embodiments, thickness uniformity at the second and third sloped sidewalls 110*b*, 110*c*. As a result, seams potentially exposing the BSGD structure 106 to an etchant used to form the BSMG 116 are less likely, whereby the BSGD structure 106 is less likely to be damaged during formation of the BSMG 116.

Figure 2A:
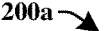
FIGS. 2A and 2B illustrate a cross-sectional view and a top layout view of some embodiments of the integrated chip of FIG. 1 with additional detail.
Figure 2A:
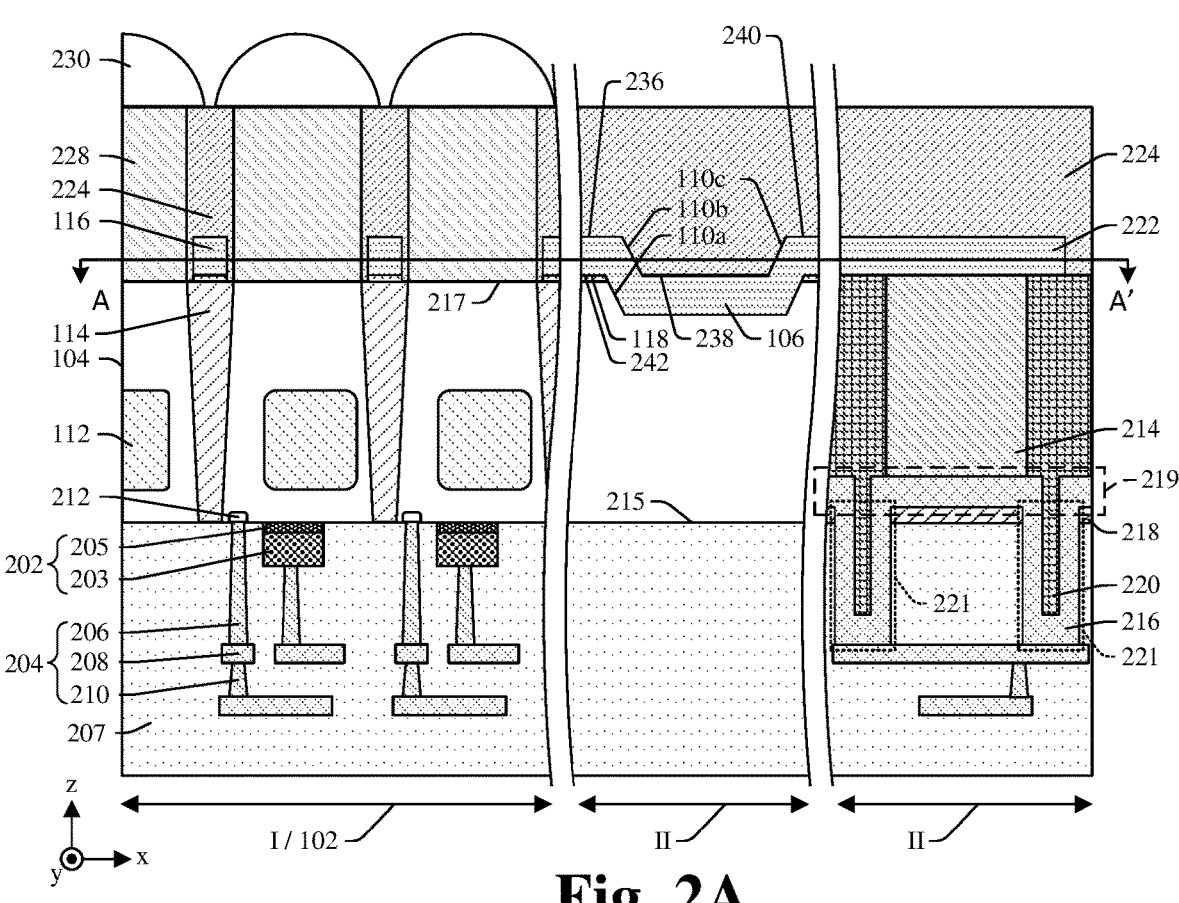
Figure 2B:
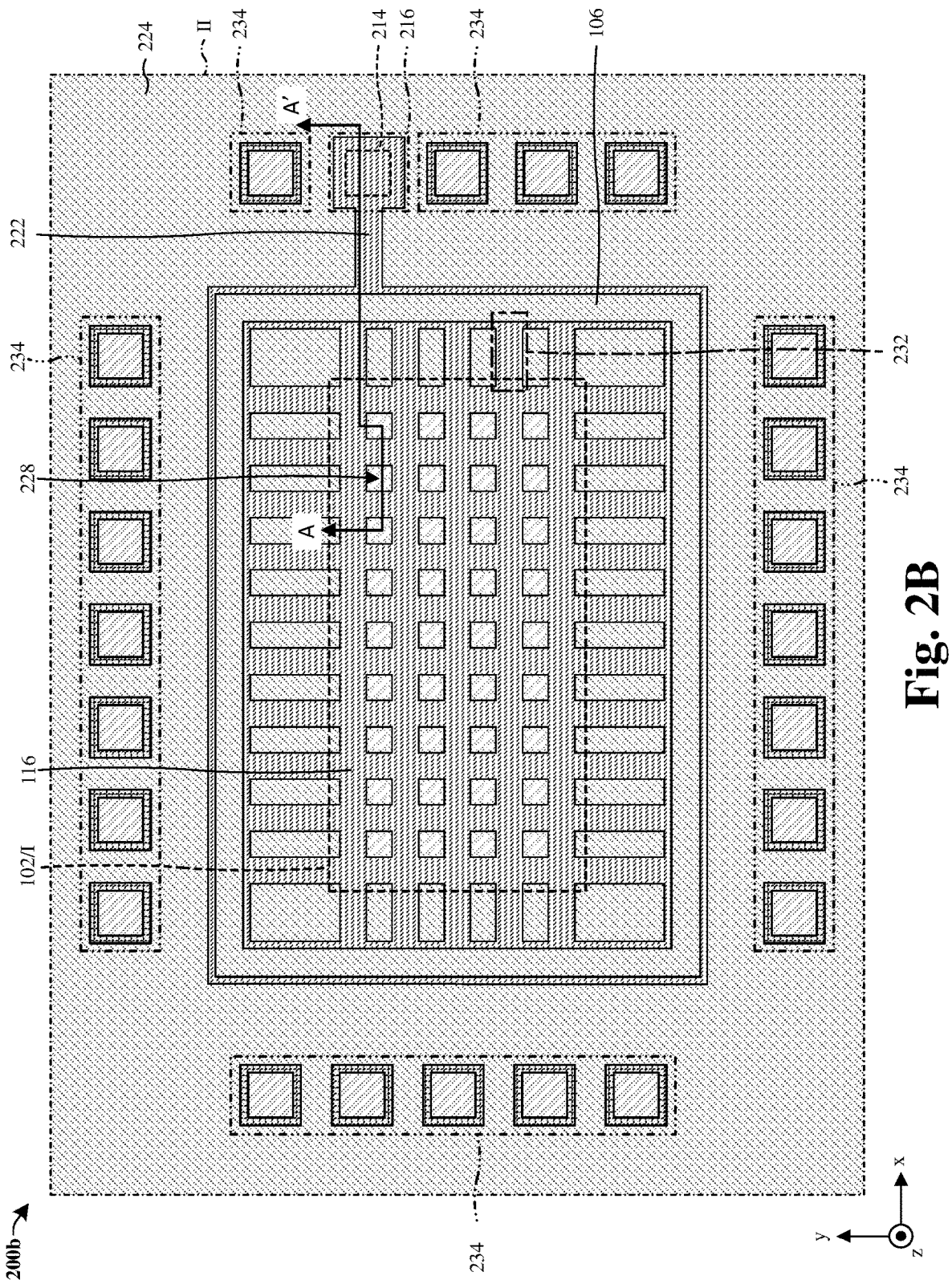

FIGS. 2A and 2B illustrate a cross-sectional view and a top layout view of some embodiments of the integrated chip of FIG. 1 with additional detail.

As shown in the cross-sectional view 200*a* of FIG. 2A, a plurality of transistors 202 are in the central region I of the integrated chip. Further, the plurality of transistors 202 are disposed on a first side 215 of the substrate 104, such that the substrate 104 is between the plurality of transistors 202 and the BSMG 116. In some embodiments, the first side 215 of the substrate 104 corresponds to a frontside of the substrate 104.

The plurality of transistors 202 comprise individual gate electrodes 203 and individual gate dielectric layers 205 that are stacked respectively with the gate electrodes 203 to form gate stacks. Further, the plurality of transistors 202 comprise individual source/drain regions in the substrate 104. The source/drain regions include collector regions of the photodetectors 112 and floating diffusion regions 212. Source/drain region(s) may refer to a source or a drain, individually or collectively dependent upon the context.

An interconnect structure 204 is on the first side 215 of the substrate 104 and electrically couples to the transistors 202. The interconnect structure 204 comprises a plurality of contacts 206 extending from the plurality of transistors 202.

Further, the interconnect structure 204 comprises a plurality of wires 208 and a plurality of vias 210.

The wires 208 and the plurality of vias 210 are alternatingly stacked to form conductive paths and are electrically coupled to the plurality of transistors 202 by the contacts 206. The plurality of wires 208 provide lateral routing between the plurality of vias 210. The plurality of vias 210 provide vertical routing between the plurality of wires 208.

The interconnect structure 204 is within the plurality of dielectric layers 207. In some embodiments, at least one etch stop layer (not shown) separates the plurality of dielectric layers 207 from one another. In some embodiments, the plurality of contacts 206, the plurality of wires 208, and the plurality of vias 210, or any combination of the foregoing are or comprise polysilicon, copper (e.g., Cu), titanium nitride (e.g., TiN), tungsten (e.g., W), aluminum (e.g., Al), tantalum nitride (e.g., TaN), the like, or any combination of the foregoing.

In some embodiments, the substrate 104 is or comprises one of a bulk semiconductor, a semiconductor-on-insulator (SOI) substrate, or the like, which may be doped (e.g., with a p-type or an n-type dopant) or undoped.

The BSGD structure 106 is on a second side 217 of the substrate 104, opposite the first side 215. In some embodiments, the second side 217 of the substrate 104 corresponds to a backside of the substrate 104. Further, the BSGD structure 106 is electrically coupled to the interconnect structure 204 by a conductive plug 214, a first pad 216, and a metal connector 222. The metal connector 222 extends from the BSGD structure 106 to the conductive plug 214, and contacts a top surface of the conductive plug 214. The conductive plug 214 extends from the metal connector 222 to the first pad 216. The first pad 216 extends from the conductive plug 214 to the interconnect structure 204. In some embodiments, the first pad 216 and the conductive plug 214, or any combination of the foregoing are or comprise copper (e.g., Cu), titanium nitride (e.g., TiN), tungsten (e.g., W), aluminum (e.g., Al), aluminum copper (e.g., AlCu), tantalum nitride (e.g., TaN), the like, or any combination of the foregoing.

The first pad 216 comprises a landing portion 219 and protrusions 221. The landing portion 219 is inset into the substrate 104 and is separated from the plurality of dielectric layers 207 by a shallow trench isolation (STI) structure 218. The STI structure 218 is or comprises silicon oxide and/or some other suitable dielectric(s). Further, the landing portion 219 corresponds to a portion of the first pad 216 on which the conductive plug 214 lands during formation and directly contacts the conductive plug 214. The protrusions 221 extend through the STI structure 218, from the landing portion 219 to the interconnect structure 204. Further, the protrusions 221 are respectively on opposite sides of the landing portion and, in some embodiments, have line-shaped top geometries extending in parallel.

A dielectric barrier 220 overlies the first pad 216 and surrounds the conductive plug 214. In some embodiments, the dielectric barrier 220 extends into the protrusions 221, lining inner sidewalls of the first pad 216.

The BSGD structure 106, the BSMG 116, and the metal connector 222 are surrounded by a second dielectric layer 224. A plurality of color filters 228 extend through the second dielectric layer 224 and the BSMG 116 in the central region I of the integrated chip. A plurality of micro-lenses 230 respectively overly the color filters 228. The color filters 228 and the micro-lenses 230 are arranged in a plurality of rows and a plurality of columns, respectively overlying the photodetectors 112 of the pixel array 102.

The second sloped sidewall 110b extends between a first upper surface 236 and a second upper surface 238. The second upper surface 238 is recessed relative to the first upper surface 236 and extends from the second sloped sidewall 110b to the third sloped sidewall 110c. In some embodiments, the second upper surface 238 is elevated relative to the second side 217 of the substrate 104. In some embodiments the second upper surface 238 is at an elevation level with the barrier layer 118. In some embodiments, the second upper surface 238 is recessed relative to a first lower surface 242 of the BSGD structure 106.

The third sloped sidewall 110c extends between the second upper surface 238 and a third upper surface 240. In some embodiments, the first upper surface 236 is both vertically and laterally spaced from the second upper surface 238 by the second sloped sidewall 110b. In some embodiments, from a cross-sectional view, the second upper surface 238 is confined between the second sloped sidewall 110b and the third sloped sidewall 110c. In some embodiments, the third upper surface 240 is substantially coplanar with the first upper surface 236 and is laterally spaced from the first upper surface 236 by the second upper surface 238, the second sloped sidewall 110b, and the third sloped sidewall 110c.

FIG. 2B illustrates a top layout view 200b of some embodiments of the integrated chip of FIG. 2A. The cross-sectional view 200a of FIG. 2A may, for example, be taken along line A-A' in FIG. 2B, and/or the top layout view 200b of FIG. 2B may, for example, be taken along line A-A' in FIG. 2A. As shown in the top layout view 200b of FIG. 2B, the BSMG 116 is in the central region I and is surrounded by the BSGD structure 106, which has a ring-shaped top geometry. Other suitable top geometries are amenable.

In some embodiments, a plurality of conductive lines 232 are arranged in a ring-shaped pattern surrounding the pixel array 102. The conductive lines 232 extend from the BSMG 116 to the BSGD structure 106, thereby electrically coupling the BSMG 116 to the BSGD structure 106. Accordingly, the BSMG 116 and the BSGD structure 106 are integrated in a common metal layer. In other embodiments, there are no conductive lines 232, and the BSMG 116 is electrically isolated from the BSGD structure 106.

In some embodiments, a plurality of pads 234 (shown in phantom), including the first pad 216 (shown in phantom), are in the peripheral region II of the integrated chip and arranged in a ring-shaped pattern along a periphery of the integrated chip. Further, the BSGD structure 106 is electrically coupled to the first pad 216 by, among other things, the metal connector 222. The metal connector 222 extends from the BSGD structure 106 to directly over the conductive plug 214 (shown in phantom). In some embodiments, from a top layout view, the second upper surface 238 (see FIG. 2A) surrounds the second sloped sidewall 110b (see FIG. 2A).

Figure 3A:
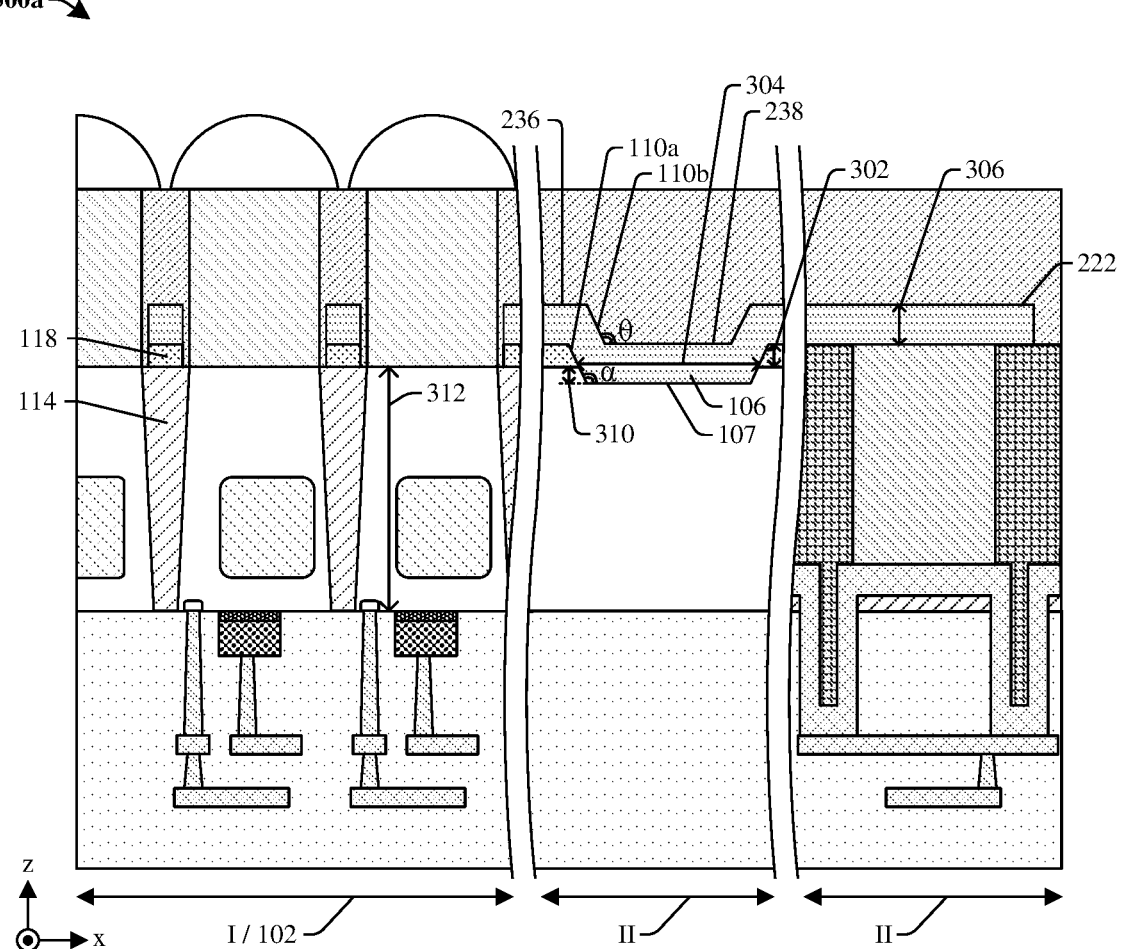
FIGS. 3A and 3B illustrate cross-sectional views of some embodiments of an integrated chip comprising a BSGD structure with sloped sidewalls.
Figure 3B:
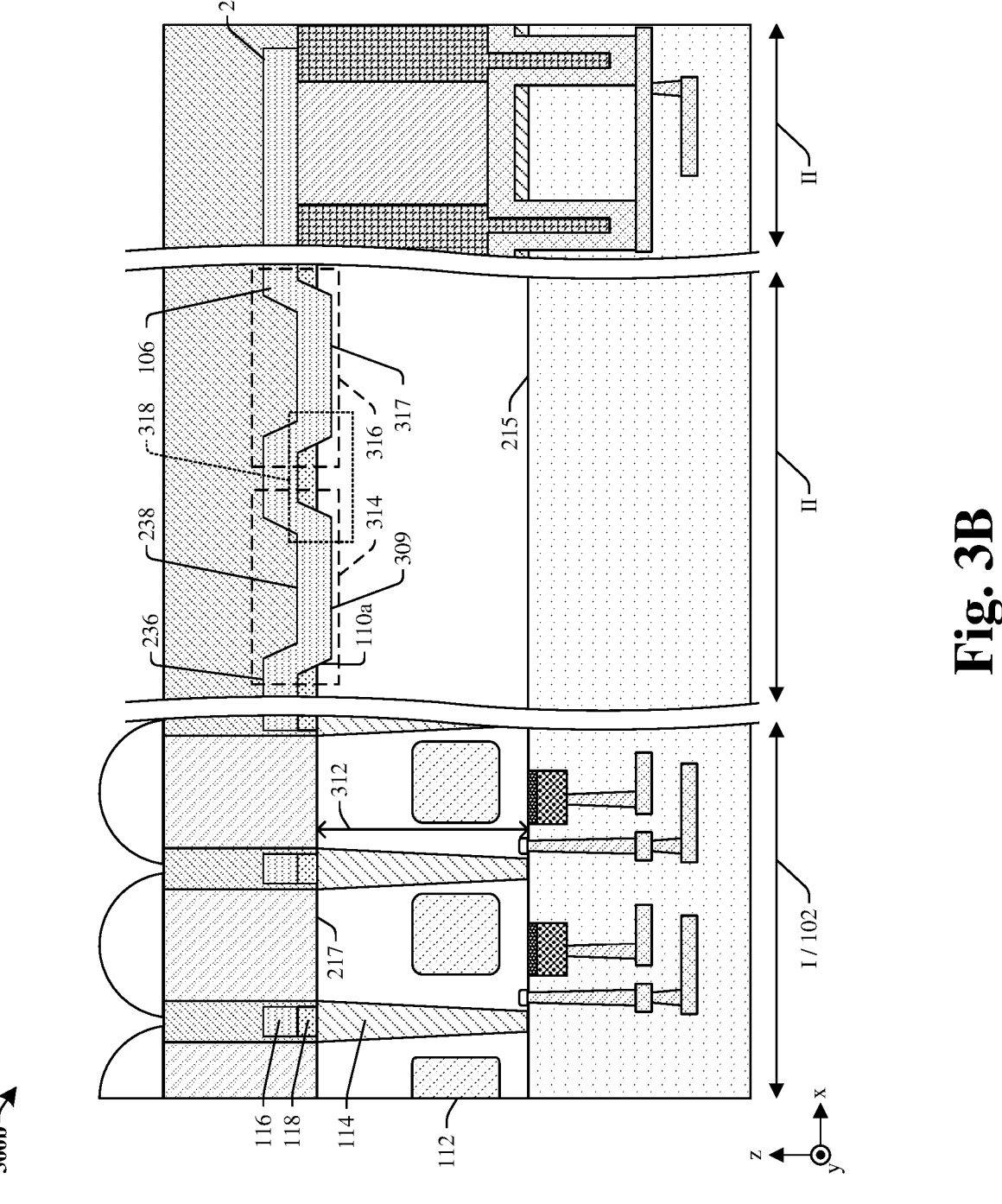

FIGS. 3A and 3B illustrates cross-sectional views of some embodiments of an integrated chip comprising a BSGD structure with sloped sidewalls.

As shown in the cross-sectional view 300a of FIG. 3A, the barrier layer 118 may have a height (or thickness) such that the bottom surface 107 of the BSGD structure 106 is closer to the second side 217 of the substrate 104 than the second upper surface 238.

In some embodiments, the barrier layer 118 has a first thickness 302 approximately between 1000 angstroms and 2000 angstroms, approximately between 800 angstroms and 1600 angstroms, approximately between 1200 angstroms and 2400 angstroms, or within another suitable range. In some embodiments, the metal connector 222 has a second thickness 306 approximately between 2500 angstroms and 3500 angstroms, approximately between 2000 angstroms and 2800 angstroms, approximately between 2800 angstroms and 4000 angstroms, or within another suitable range.

In some embodiments, the BSGD structure 106 extends into the substrate 104 to a first depth 310 approximately between 200 angstroms and 500 angstroms, approximately between 100 angstroms and 400 angstroms, approximately between 300 angstroms and 600 angstroms, or within another suitable range.

In some embodiments, the first thickness 302 of the barrier layer 118 is greater than the first depth 310 to which the BSGD structure 106 extends into the substrate 104. In some embodiments, the BDTI structure 114 extends into the substrate 104 to a second depth 312, and the second depth 312 is greater than the first depth 310. In alternative embodiments, the second depth 312 is less than the first depth 310.

In some embodiments, the BSGD structure 106 has a width 304 approximately between 0.3 micrometers and 1 micrometer, approximately between 0.2 micrometers and 0.5 micrometers, approximately between 0.7 micrometers and 1.2 micrometers, or within another suitable range. In some embodiments, the width 304 of the BSGD structure 106 decreases continuously into the second side 217 of the substrate 104.

In some embodiments, the first sloped sidewall 110a extends from the bottom surface 107 of the BSGD structure 106 at a first obtuse angle α equal to or greater than 110 degrees. In some embodiments, the second sloped sidewall 110b is angled away from the second upper surface 238 at a second obtuse angle θ equal to or greater than 110 degrees. In some embodiments, first and second obtuse angles α, θ are the same or substantially the same.

As shown in the cross-sectional view 300b of FIG. 3B, the BSGD structure 106 comprises a first continuous ring 314 and a second continuous ring 316. The first and second continuous rings 314, 316 are in the peripheral region II and extend in individual closed paths along a periphery of the IC chip to surround the central region I and the pixel array 102. In some embodiments, the BSMG 116 extends in a third continuous ring around the pixel array 102, and the first and second continuous rings surround the third continuous ring.

In some embodiments, the substrate 104 has a second recessed surface 317, wherein the second recessed surface 317 is recessed to an elevation level with the first recessed surface 309 and is separated from the first recessed surface 309 by a ridge 318. In further embodiments, the ridge 318 has an upper surface at an elevation level with the second side 217 of the substrate 104, and the upper surface is laterally spaced from the first and second recessed surfaces 309, 317 by sloped sidewalls of the BSGD structure 106.

FIGS. 4-14 illustrate a series of cross-sectional views 400-1400 of some embodiments of a method form forming an integrated chip comprising a BSGD structure with sloped sidewalls. The method may, for example, be employed to form the integrated chip of FIG. 2A or the like. Although FIGS. 4-14 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 4:
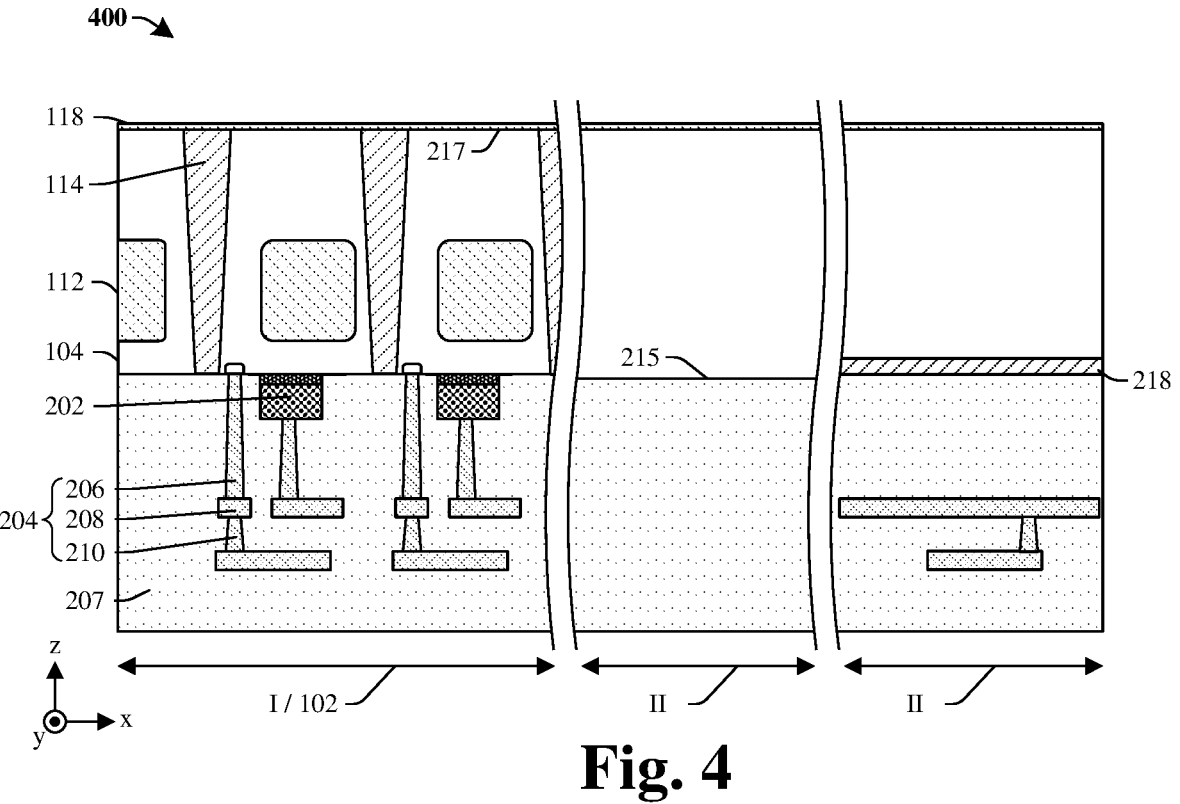
FIGS. 4, 5, 6A-6C, and 7-14 illustrate a series of cross-sectional views of some embodiments of a method for forming an integrated chip comprising a BSGD structure with sloped sidewalls.

As shown in the cross-sectional view 400 of FIG. 4, the integrated chip is partially formed. A plurality of transistors 202 and an array of photodetectors 112 are formed at a central region I of the integrated chip, which is surrounded by a peripheral region II of the integrated chip. The photodetectors 112 are formed in the substrate 104, and the transistors 202 are formed on a first side 215 of the substrate 104. The photodetectors 112 are grouped with the transistors 202 and form pixel sensors that repeat in a plurality of rows and a plurality of columns. The pixel sensors may, for example, be 4T active pixel sensors (APSs) or the like.

An interconnect structure 204 is formed on the first side 215 of the substrate 104, coupled to the transistors 202. The interconnect structure 204 comprises a plurality of contacts 206, a plurality of wires 208, and a plurality of vias 210 that are stacked in a plurality of dielectric layers 207 to define conductive paths extending from the transistors 202. In some embodiments, an STI structure 218 is formed on the first side 215 of the substrate 104 in the peripheral region II.

A BDTI structure 114 and a barrier layer 118 are formed from a second side 217 of the substrate, opposite the first side 215 of the substrate 104. The BDTI structure 114 is formed extending into the substrate 104 and separating the photodetectors 112 from each other. The BDTI structure 114 is or comprises a high k dielectric and/or some other suitable dielectric(s). The barrier layer 118 is formed blanketing the second side 217 of the substrate 104. In some embodiments, the barrier layer 118 is or comprises an oxide (e.g., silicon dioxide ($SiO_2$)), a high-K dielectric material, the like, or some combination of the foregoing.

Figure 5:
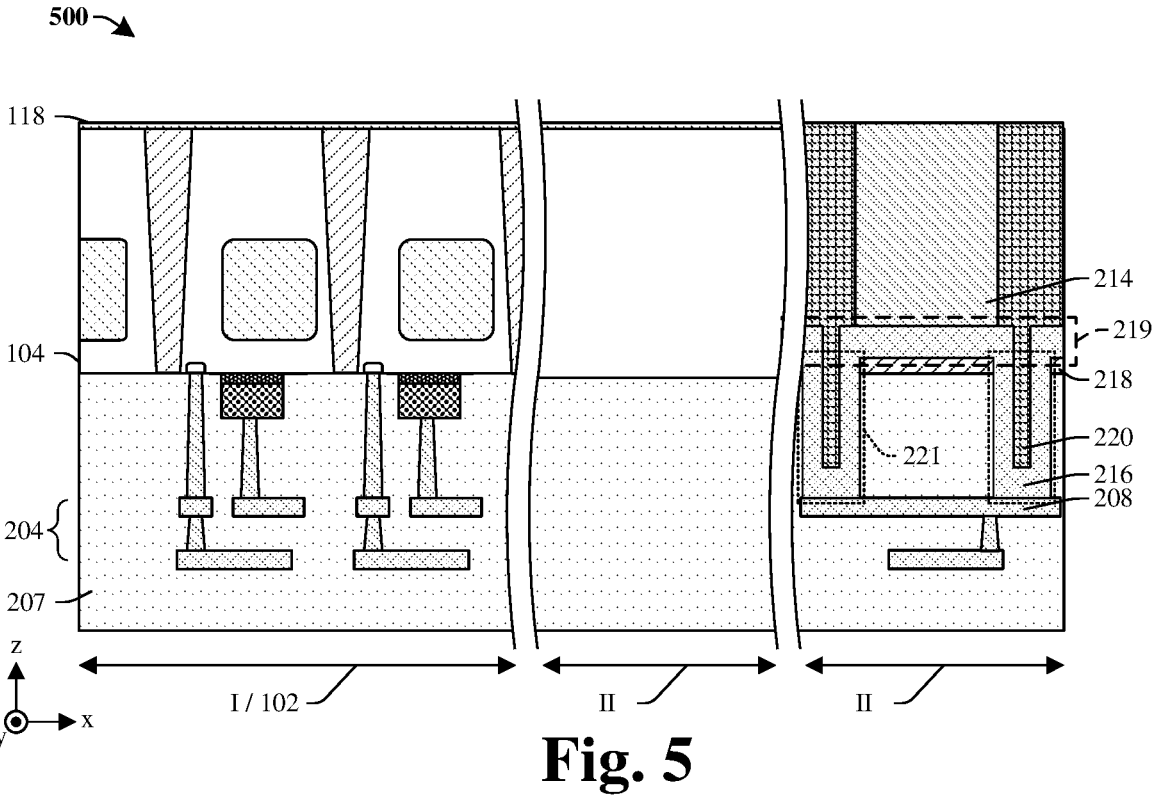

As shown in the cross-sectional view 500 of FIG. 5, a first pad 216 is formed in the peripheral region II of the integrated chip. The first pad 216 is formed electrically contacting the interconnect structure 204. The first pad 216 comprises a landing portion 219 and protrusions 221. The landing portion 219 is inset into the substrate 104 and is separated from the plurality of dielectric layers 207 by the STI structure 218. The protrusions 221 extend through the STI structure 218, from the landing portion 219 to the interconnect structure 204. Further, the protrusions 221 are respectively on opposite sides of the landing portion and, in some embodiments, have line-shaped top geometries extending in parallel.

Also shown in the cross-sectional view 500 of FIG. 5, a conductive plug 214 and a dielectric barrier 220 are formed overlying the first pad 216 and inset into the substrate 104. The conductive plug 214 extends from the landing portion 219 to the second side 217 of the substrate 104, and the dielectric barrier 220 surrounds the conductive plug 214.

Figure 6A:
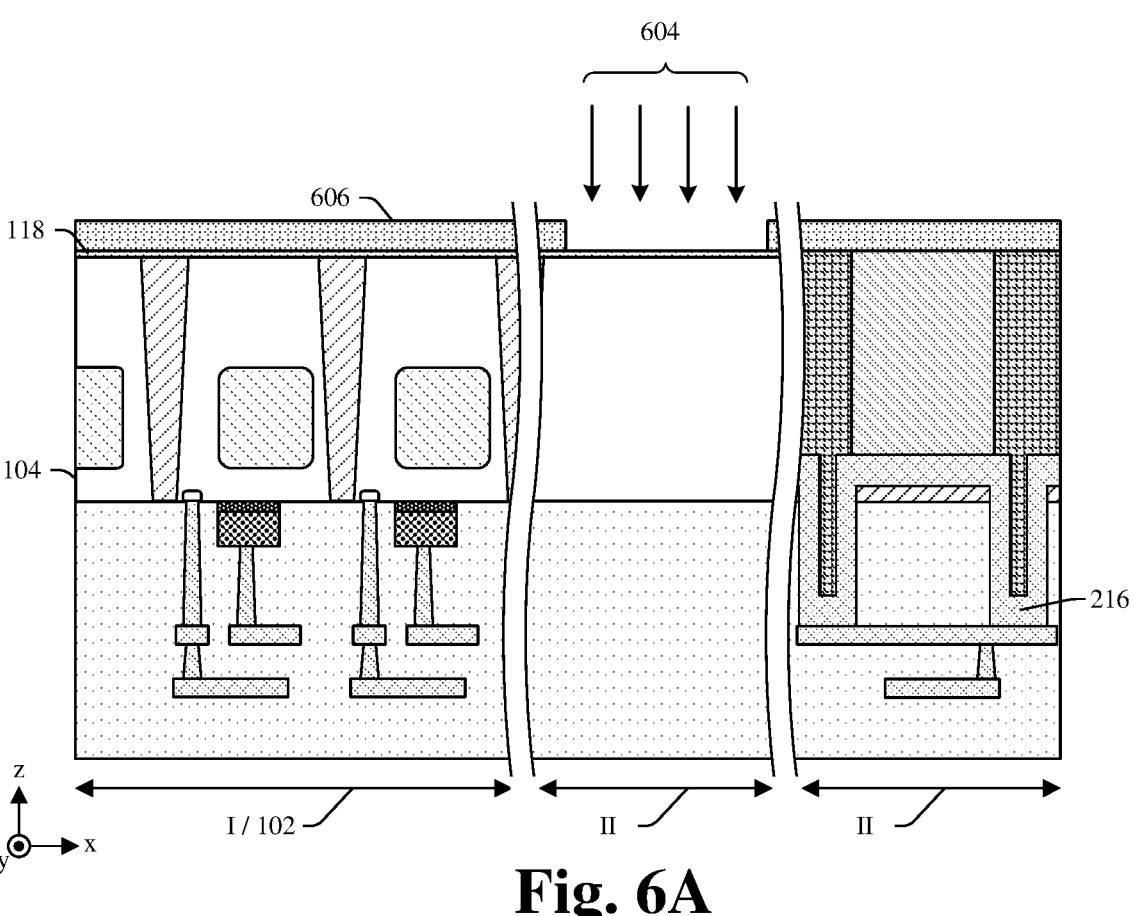
Figure 6B:
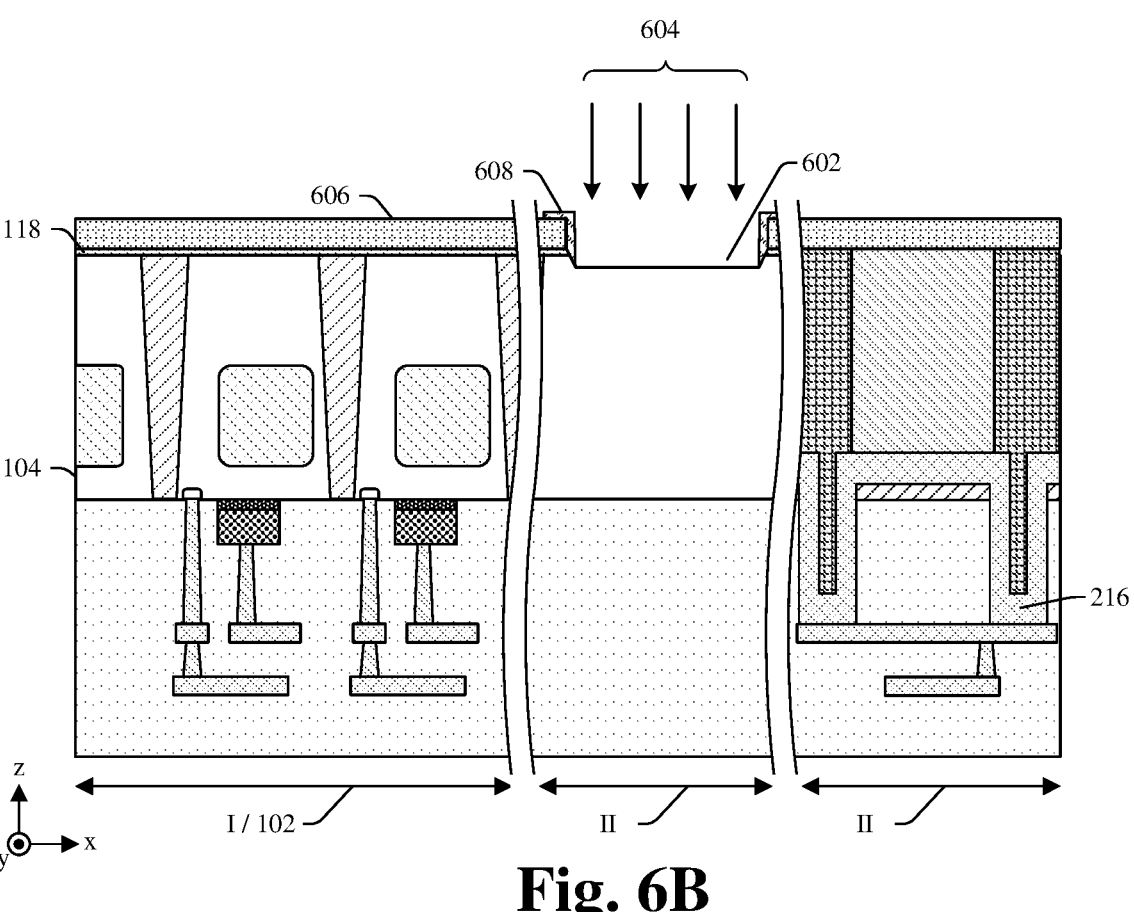
Figure 6C:
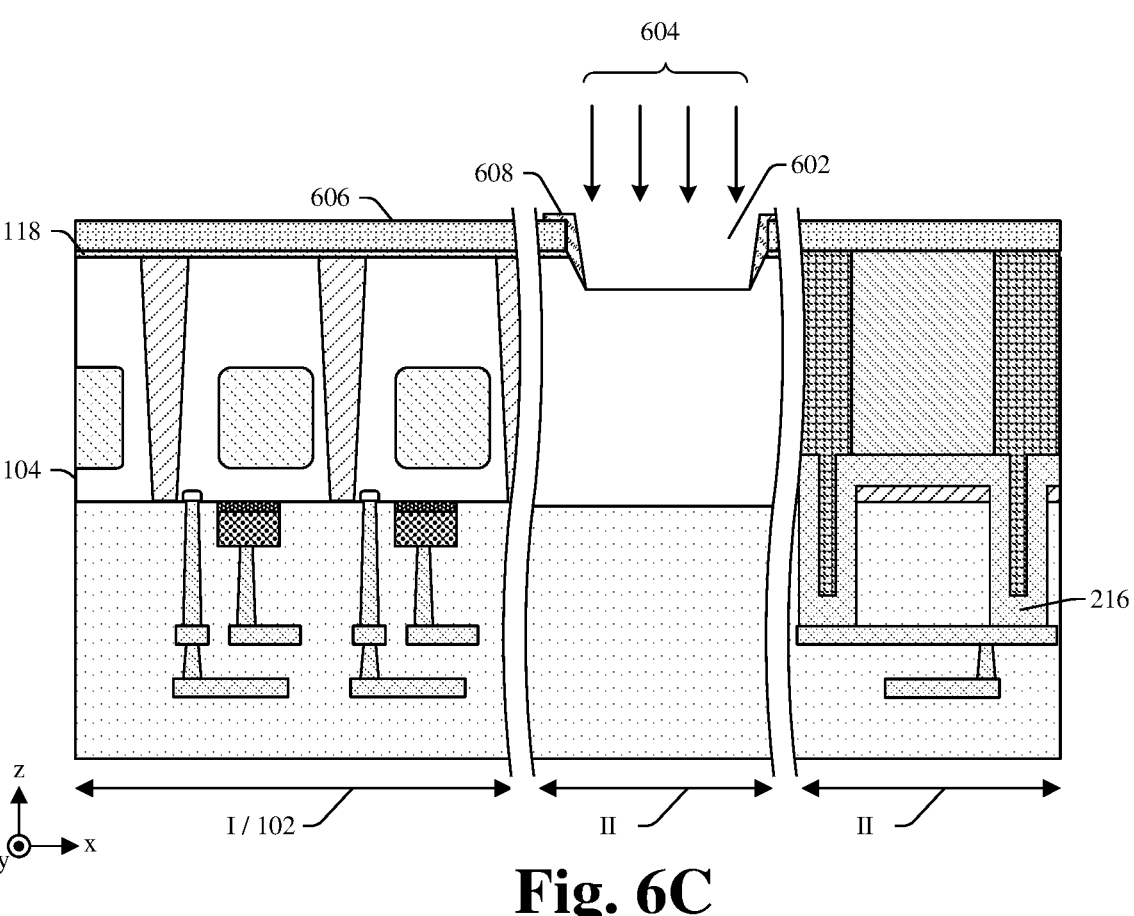

As shown in the cross-sectional views 600a-600c of FIGS. 6A-6C, a process for forming a tapered opening 602 extending through the barrier layer 118 into the substrate 104 is performed. FIGS. 6A-6C illustrate formation of the tapered opening 602 at different time points.

As shown in the cross-sectional view 600a of FIG. 6A, in some embodiments, a first mask 606 is formed with a top layout of the tapered opening 602 to be formed hereafter. In some embodiments, the first mask 606 is or comprises silicon oxynitride and/or other suitable materials. In some embodiments, the first mask 606 is or comprises photoresist or other suitable materials, and/or is formed by photolithography or some other suitable process.

As shown in the cross-sectional view 600b of FIG. 6b, a first etch 604 is performed with the first mask in place to form the tapered opening 602. The tapered opening 602 is formed extending through the barrier layer 118 into the substrate 104, such that the barrier layer 118 and the substrate 104 have sloped sidewalls in the tapered opening 602. Further, the tapered opening 602 is formed in the peripheral region II, between the first pad 216 and the pixel array 102. In some embodiments, the tapered opening 602 extends in a closed path along a periphery of the pixel array 102 to surround the pixel array 102. In some embodiments, the tapered opening 602 is etched using a single step etching process.

During the first etch 604, a polymer layer 608 is deposited along sidewalls of the etched area simultaneously while the substrate 104 is etched. The polymer layer 608 serves as a mask, which progressively reduces the width of the etched surface and causes the tapered opening 602 to have the taper and hence sloped sidewalls.

In some embodiments, an etchant of the first etch 604 is or comprises carbon tetrafluoride (e.g., $CF_4$), whereby the polymer layer 608 is a fluorocarbon polymer. In some embodiments, the etchant further comprises trifluoromethane (e.g., $CHF_3$). A combination of tetrafluoride and trifluoromethane allows the ratio of carbon (e.g., C) to fluorine (e.g., F) to be tuned. Increasing the ratio of carbon to fluorine increases the deposition rate of the polymer layer 608 and hence increases a taper of the tapered opening 602. In some embodiments, the first etch 604 is a dry etching process (e.g., plasma dry etching). In further embodiments, the first etch 604 is performed by plasma etch using the combination.

As shown in the cross-sectional view 600c of FIG. 6c, the first etch 604 continues to completion. As such, the polymer layer 608 is thicker and the tapered opening 602 extends deeper into the substrate 104 than in FIG. 6b.

Figure 7:
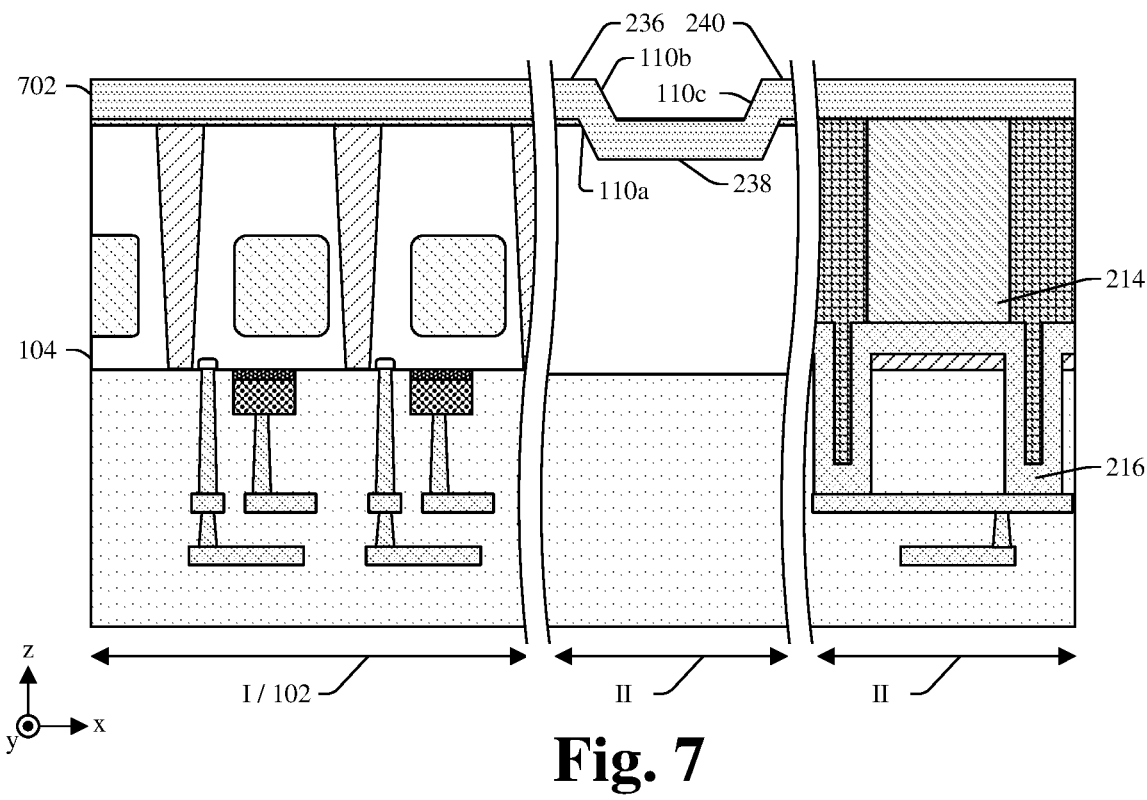

As shown in the cross-sectional view 700 of FIG. 7, upon completion of the first etch 604, the polymer layer 608 is removed. The polymer layer 608 is removed using one or more stripping processes, one or more ashing processes, some other process, or a combination of the foregoing. The removal of the polymer layer 608 may be performed in-situ with the first etch 604 or may be performed ex-situ.

Also shown in the cross-sectional view 700 of FIG. 7, a metal layer 702 is deposited over the substrate 104. The metal layer 702 lines the substrate 104 and the tapered opening 602 (see FIG. 6c), whereby the metal layer 702 has a first sloped sidewall 110a facing the pixel array 102. Further, the metal layer 702 conforms to the tapered profile of the tapered opening 602, whereby the metal layer 702 has a top indent at the tapered opening 602.

The top indent accommodates a second sloped sidewall 110b and a third sloped sidewall 110c respectively on opposite side of the top indent. The second sloped sidewall is opposite the first sloped sidewall 110a and faces an opposite direction as the first sloped sidewall 110a. The second and third sloped sidewalls 110b, 110c extend between first, second and third upper surfaces 236, 238, 240 of the metal layer 702. The metal layer 702 extends over the pixel array 102, and further extends over the first pad 216 and contacts a top surface of the conductive plug 214. In some embodiments, the metal layer 702 is formed using chemical vapor deposition (CVD), physical vapor deposition (PVD), atomic layer deposition (ALD), sputtering, electrochemical plating, electroless plating, some other suitable deposition process, or a combination of the foregoing.

If sidewalls of the tapered opening 602 were vertical instead of sloped, the metal layer 702 may deposit (e.g., by PVD or the like) with poor step coverage and conformity on the sidewalls. A thickness of the metal layer 702 may gradually decrease along the sidewalls from top to bottom, whereby the metal layer 702 may fail to cover or minimally cover the sidewalls at bottom edges of the sidewalls. This may potentially lead to seams forming in subsequently deposited layers that allow damage to come to the metal layer 702 during subsequent processing. However, the sidewalls of the tapered opening 602 are sloped instead of vertical, the metal layer 702 deposits with increased step coverage of sidewalls. Further, in some embodiments, the metal layer 702 deposits with increased conformity in the tapered opening 602. As seen hereafter, the increased step coverage reduces the likelihood of seams forming in subsequently deposited layers and hence reduces the likelihood of damage to the metal layer 702.

Figure 8:
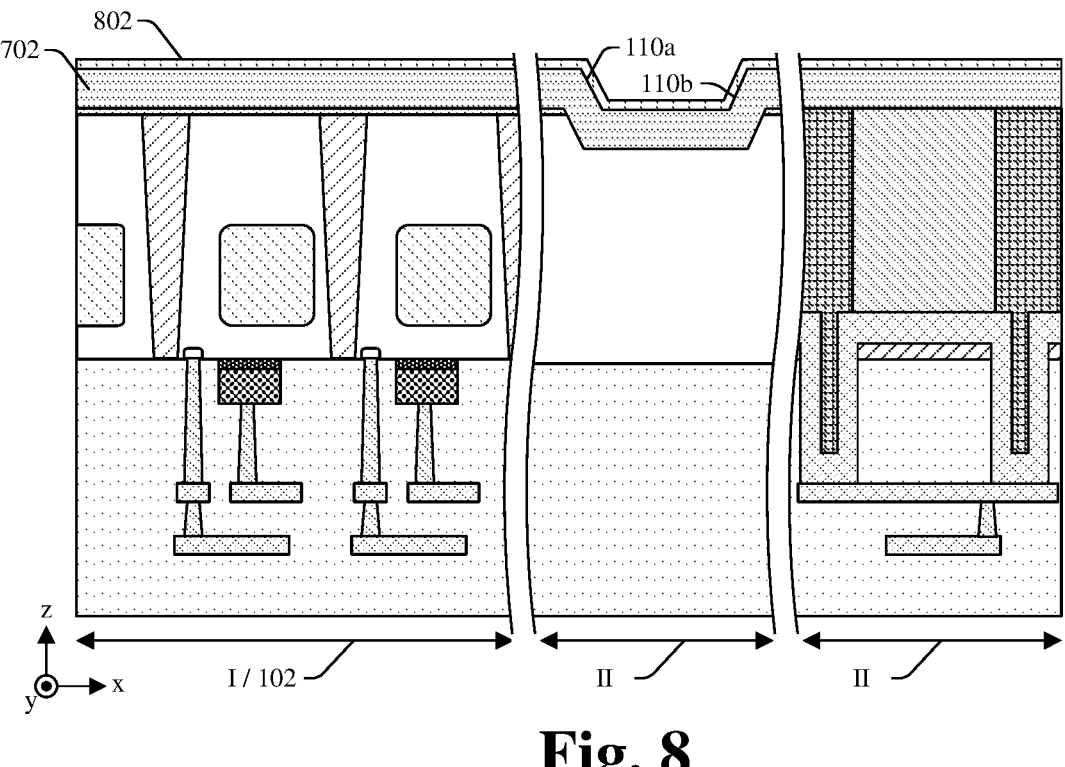

As shown in the cross-sectional view 800 of FIG. 8, an anti-reflection coating 802 is deposited over the metal layer 702 and conformally lining the top indent of the metal layer 702 at the tapered opening 602 (see, e.g., FIG. 6c). In some embodiments, the anti-reflection coating 802 is or comprises silicon oxynitride (SiON) and/or the like. In some embodiments, the anti-reflection coating 802 is formed using CVD, PVD, ALD, some other process, or a combination of the foregoing.

If sidewalls of the tapered opening 602 were vertical, the metal layer 702 may deposit (e.g., by PVD or the like) with a thickness that gradually decrease along the sidewalls from top to bottom. Hence, the metal layer 702 may overhang the tapered opening 602. This may propagate to deposition of the anti-reflection coating 802, whereby the anti-reflection coating 802 may deposit (e.g., by PVD or the like) with a thickness that gradually decreases from top to bottom along sidewalls of the metal layer 702 in the top indent. Hence, the anti-reflection coating 802 may overhang the top indent and/or have a seams exposing the metal layer 702 at a bottom of the top indent. However, because the tapered opening 602 is tapered and hence has sloped sidewalls, the top indent of the metal layer 702 is also tapered and hence has sloped sidewalls. This leads to increased step coverage of the sloped sidewalls during deposition of the anti-reflection coating 802 and, in some embodiments, leads to increased conformity of the anti-reflection coating 802. Hence, seams are less likely to form in the anti-reflection coating 802.

Figure 9:
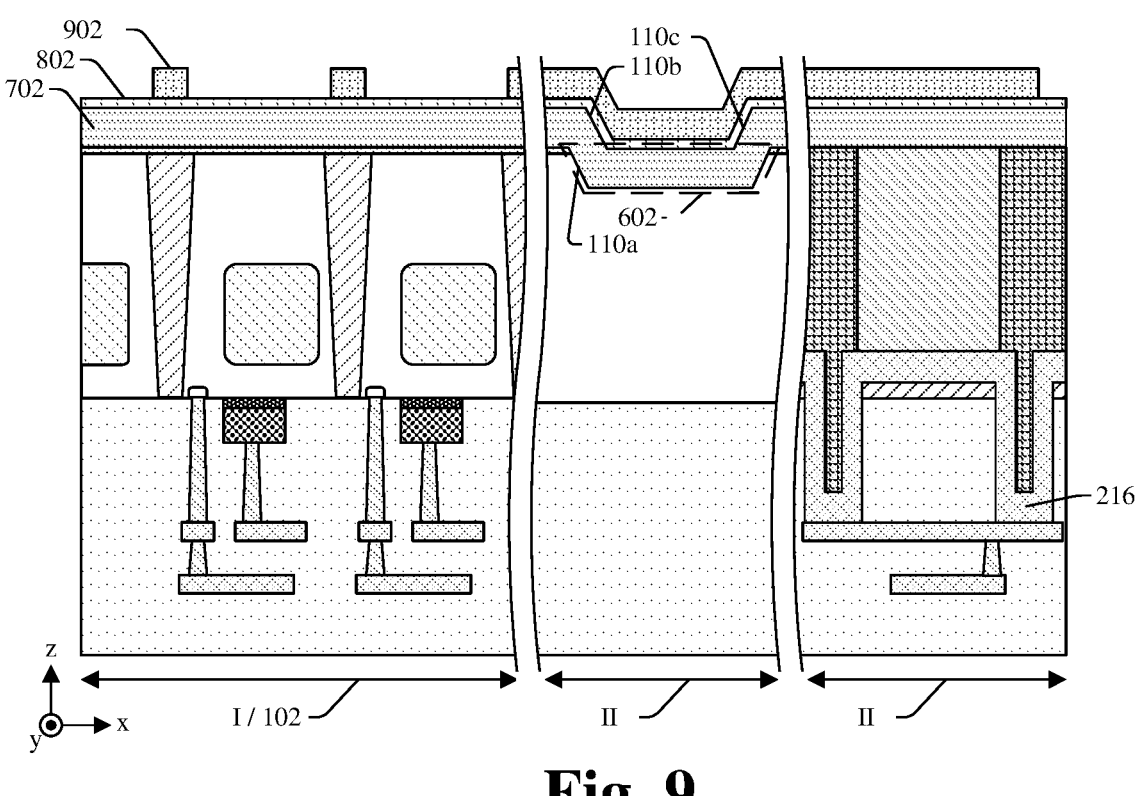

As shown in the cross-sectional view 900 of FIG. 9, a second mask 902 is formed over the anti-reflection coating 802. The second mask 902 covers portions of the metal layer 702 with a layout corresponding to the BSMG 116 (See FIG. 2A), the BSGD structure 106 (See FIG. 2A), and the metal connector 222 (See FIG. 2A) overlying the first pad 216 formed hereafter. In some embodiments, the second mask 902 is or comprises silicon oxynitride and/or other suitable materials. In some embodiments, the second mask 902 is or comprises photoresist or other suitable materials. In some embodiments, the second mask 902 is deposited on the integrated chip. The second mask 902 is then exposed to ultraviolet light. The second mask 902 is then developed, patterning the second mask 902 using a chemical developer. In some embodiments, the integrated chip is immersed in the chemical developer during the development process. The second mask 902 covers the anti-reflection coating 802 over the tapered opening 602 (shown in phantom).

Figure 10:
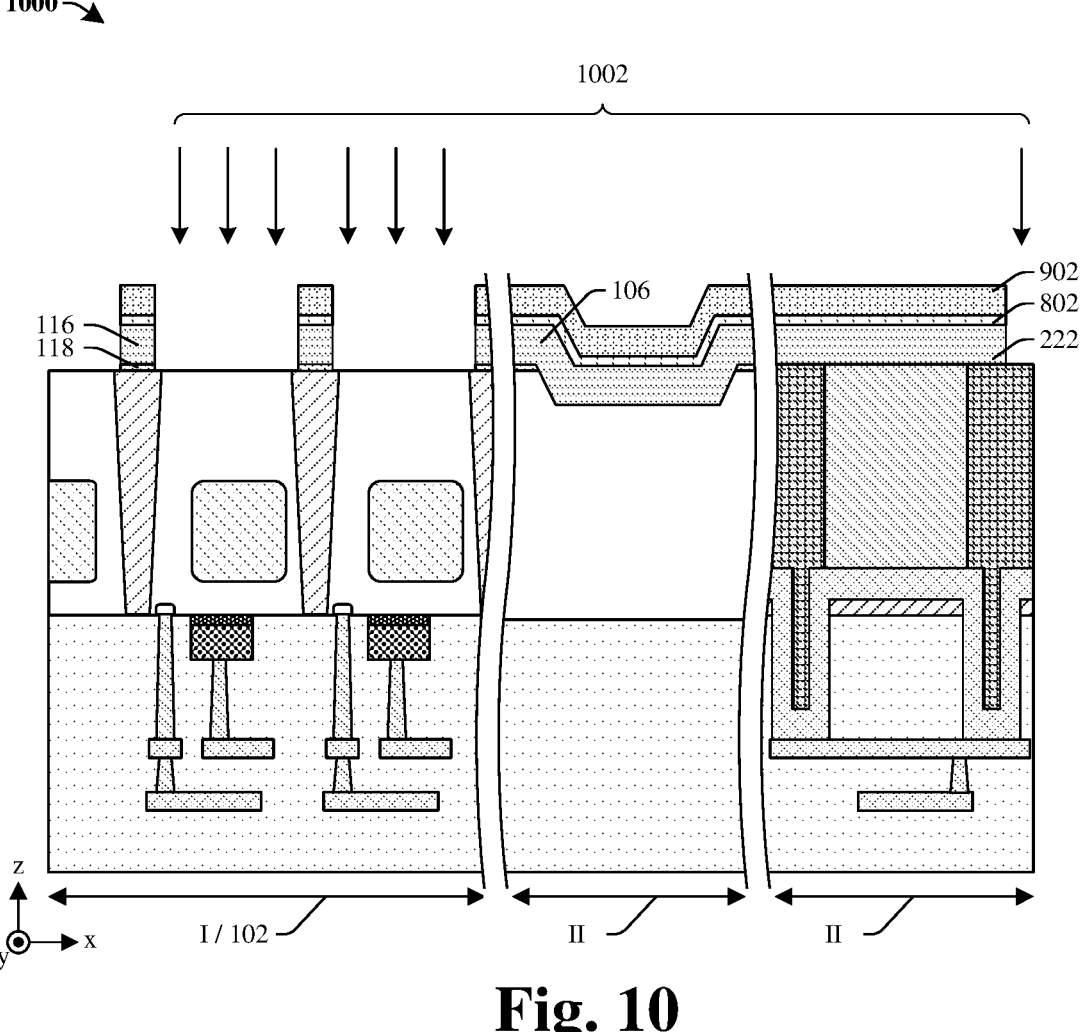

As shown in the cross-sectional view 1000 of FIG. 10, a second etch 1002 is performed with the second mask 902 in place, thereby removing portions of the metal layer 702 (see FIG. 10) to form the BSMG 116, the BSGD structure 106, and the metal connector 222. In some embodiments, the second etch 1002 is a dry etching process (e.g., plasma dry etching). In some embodiments, the BSMG 116 and the BSGD structure 106 are electrically coupled. In other embodiments, the BSMG 116 and the BSGD structure 106 are separated by the second etch 1002. The BSGD structure 106 forms a closed path around the array of photodetectors 112, and the BSMG 116 also forms a closed path around the array of photodetectors 112. The BSGD structure entirely surrounds the BSMG 116. The function of the BSGD structure 106 is to remove charge in the substrate 104 that results from the first and second etch 604, 1002.

In some embodiments, the second etch 1002 erodes the second mask 902 to expose the anti-reflection coating 802 at the tapered opening 602 (see, e.g., FIG. 6c). As such, the anti-reflection coating 802 may become exposed to an etchant of the second etch 1002 at the tapered opening 602. Therefore, any seams in the anti-reflection coating 802 may allow the etchant to come into contact with the metal layer 702 (see, e.g., FIG. 9), thereby damaging the BSGD structure 106. However, because of the tapered opening 602, seams are less likely and hence damage to the BSGD structure 106 is less likely. This improves manufacturing yields and potentially improves image quality since the BSGD structure 106 serves to remove charge in the substrate 104 that negatively impact image quality.

Figure 11:
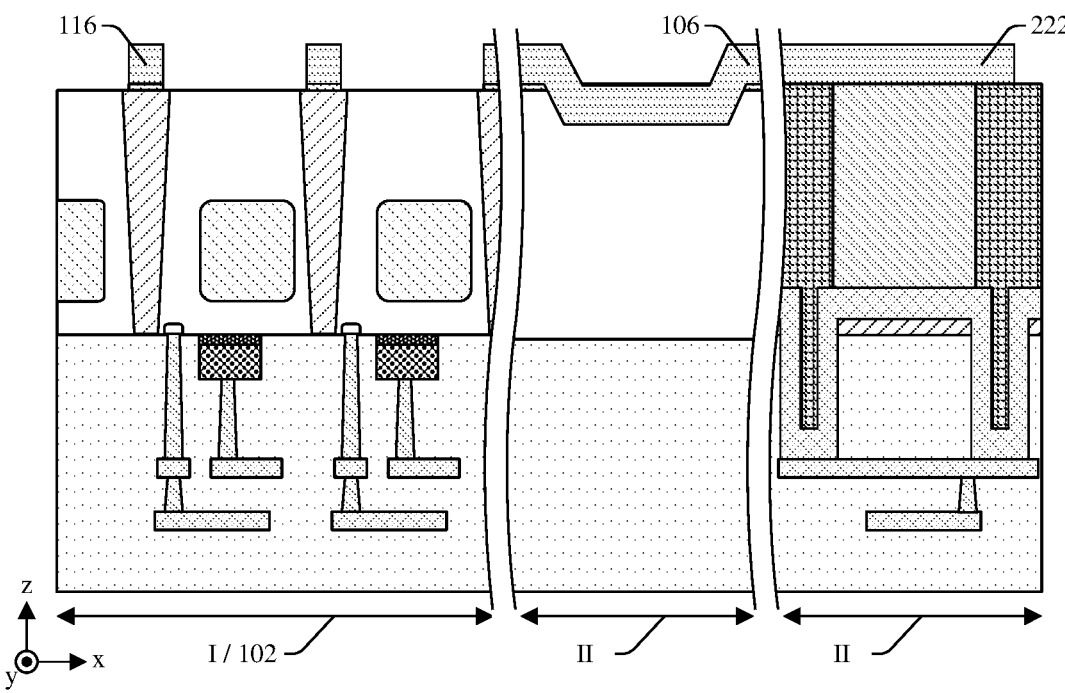

As shown in the cross-sectional view 1100 of FIG. 11, the second mask 902 (see FIG. 10) and the anti-reflection coating 802 (see FIG. 10) are removed, thereby exposing top surfaces of the BSMG 116, the BSGD structure 106, and the metal connector 222. The second mask 902 and the anti-reflection coating 802 are removed using one or more etching processes, one or more stripping processes, one or more ashing processes, some other process, or a combination of the foregoing.

Figure 12:
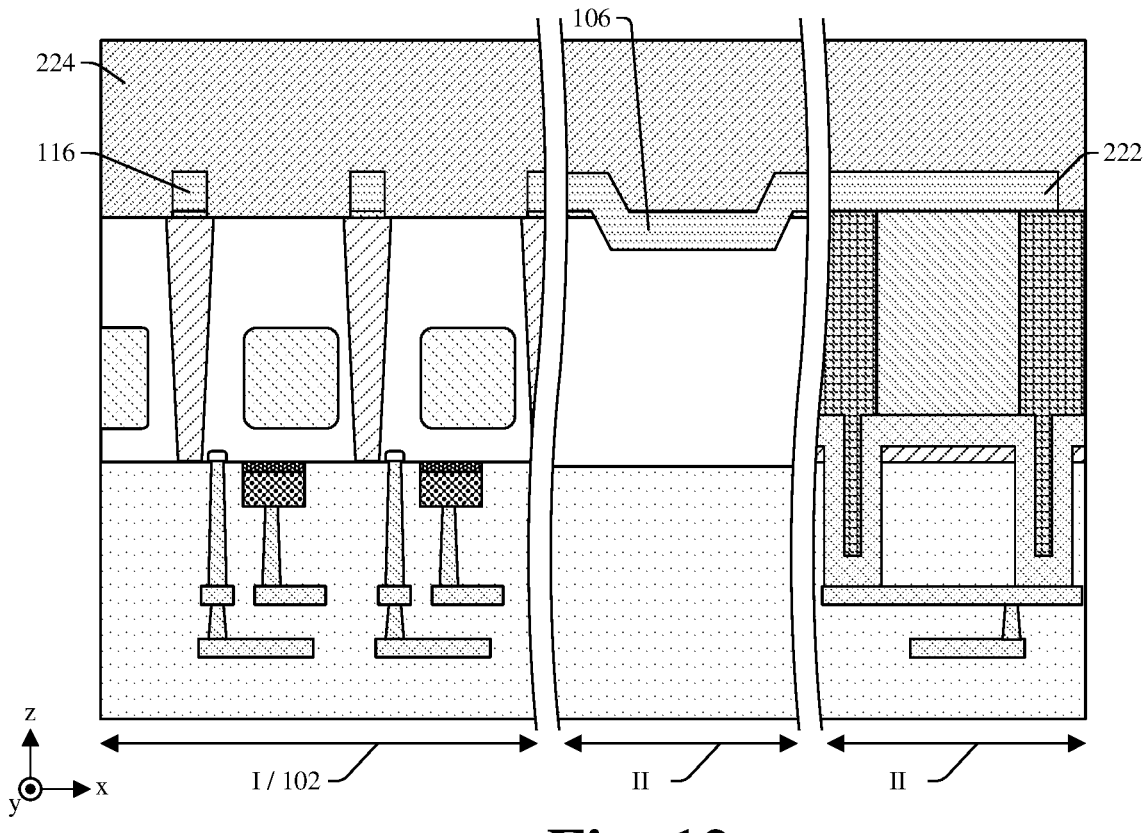

As shown in the cross-sectional view 1200 of FIG. 12, a second dielectric layer 224 is deposited over the BSMG 116, the BSGD structure 106, and the metal connector 222. The second dielectric layer comprises one of an oxide (e.g., silicon dioxide ($SiO_2$)), a low-κ dielectric material, an extreme low-κ dielectric material, the like or any combination of the foregoing. In some embodiments, the second dielectric layer 224 is deposited using CVD, PVD, ALD, some other process, or a combination of the foregoing.

Figure 13:
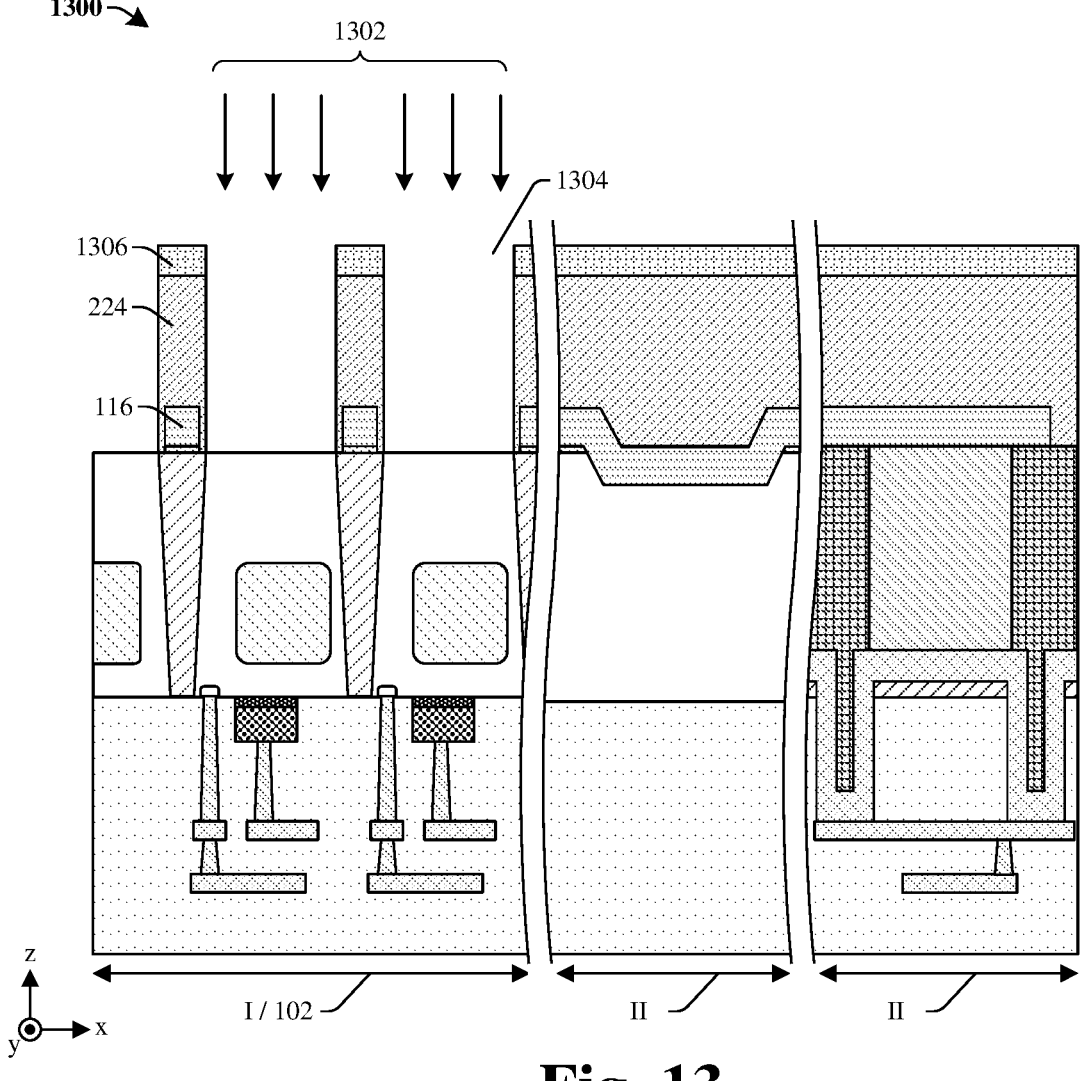

As shown in the cross-sectional view 1300 of FIG. 13, a third etch 1302 is performed, thereby forming openings 1304 in the second dielectric layer 224 over the pixel array 102. In some embodiments, a process for performing the third etch 1302 comprises forming a third mask 1306 over the second dielectric layer 224, where the third mask 1306 corresponds to portions of the second dielectric layer 224 overlying the BSMG 116. The third etch 1302 is performed with the third mask 1306 in place, thereby removing exposed portions of the second dielectric layer 224 corresponding to pixels of the pixel array 102. Further, the third mask 1306 is removed.

Figure 14:
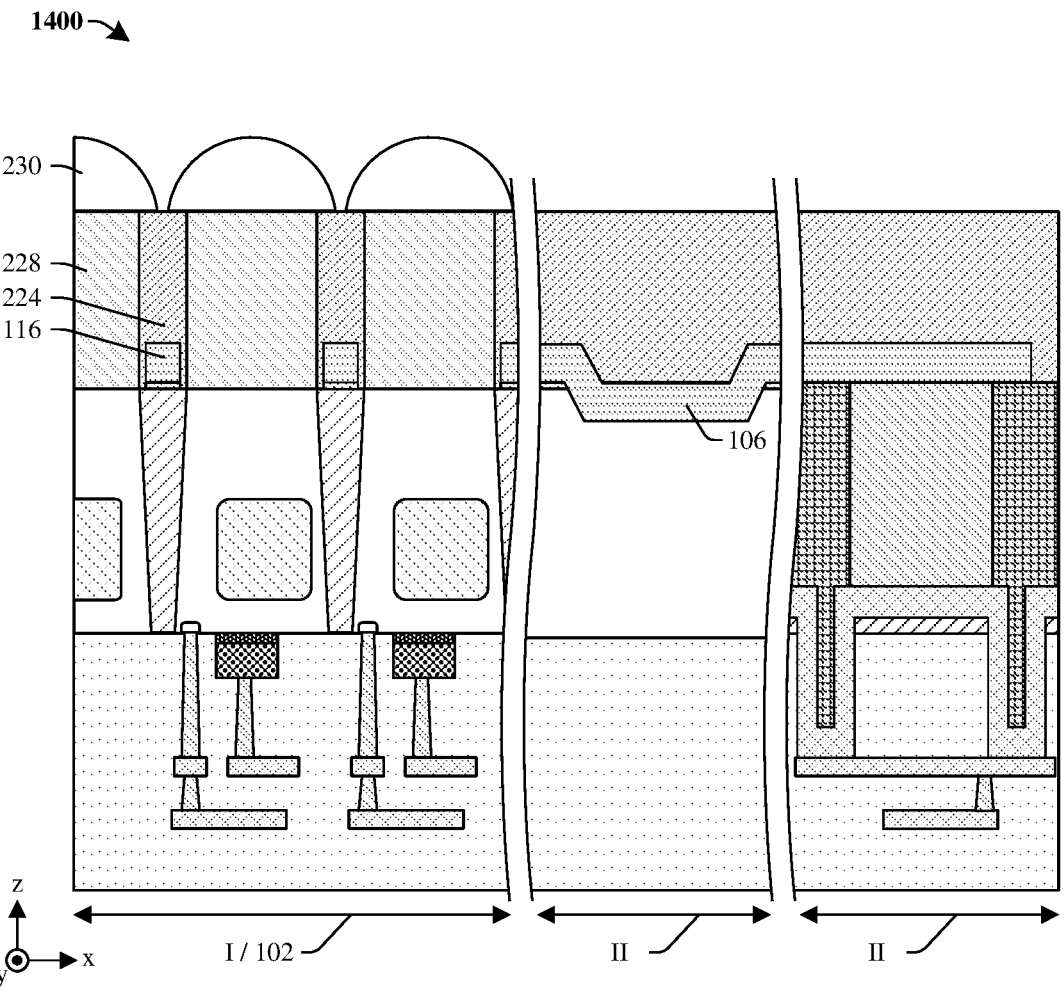

As shown in the cross-sectional view 1400 of FIG. 14, a plurality of color filters 228 and the plurality of micro-lenses 230 are formed across the second dielectric layer 224. The plurality of color filters 228 are formed within the openings 1304 in the second dielectric layer 224, and the color filters 228 overlie the micro-lenses 230.

FIG. 15 illustrates a flow diagram 1500 of some embodiments of a method for forming an integrated chip comprising a BSGD structure with sloped sidewalls.

While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1502, a photodetector array is formed within a substrate. See, for example, FIG. 4.

At 1504, a transistor is formed on a first side of the substrate. See, for example, FIG. 4.

At 1506, a tapered opening is etched into a second side of the substrate, opposite the first side, wherein the tapered opening extends in a closed path along a periphery of the photodetector array to surround the photodetector array. See, for example, FIGS. 6A, 6B, and 6C.

At 1508, a metal layer is deposited over the substrate, conforming to the tapered opening wherein a top of the metal layer is depressed at the tapered opening. See, for example, FIG. 7.

At 1510, the metal layer is patterned to form a backside ground (BSGD) structure surrounding the photodetector array in the tapered opening. See, for example, FIG. 10.

At 1512, the metal layer is patterned to form a grid structure extending on another closed path around the photodetector array, wherein the BSGD structure surrounds the grid structure. See, for example, FIG. 10.

At 1514, color filters and micro-lenses are formed overlying the photodetector array on the second side of the substrate. See, for example, FIGS. 12-14.

Therefore, the present disclosure relates to a method of forming an integrated chip comprising a backside ground with sloped sidewalls to mitigate defects in the backside ground.

Some embodiments relate to an integrated chip including a semiconductor substrate and a pixel array comprising a plurality of photodetectors in the semiconductor substrate. The pixel array further comprises a plurality of transistors on a frontside of the semiconductor substrate. A backside ground (BSGD) structure extends into a backside of the semiconductor substrate, opposite the frontside, and further surrounding the pixel array along a periphery of the pixel array. The BSGD structure has a first sloped sidewall extending from a bottom surface of the BSGD structure that is recessed into the semiconductor substrate.

In other embodiments, the present disclosure relates to an integrated chip including a substrate and an array of photodetectors in the substrate. A plurality of transistors underly the substrate on a first side of the substrate. A metal ground structure overlies the substrate on a second side of the substrate, opposite the first side of the substrate. A width of the metal ground structure decreases continuously from a top surface of the substrate to a first recessed surface of the substrate. The first recessed surface is recessed relative to the top surface, and the top and first recessed surfaces face a common direction.

In yet other embodiments, the present disclosure relates to a method of forming an integrated chip, the method including form forming a photodetector array within a substrate; forming a transistor on a first side of the substrate; etching a tapered opening into a second side of the substrate, opposite the first side, wherein the tapered opening extends in a closed path along a periphery of the photodetector array to surround the photodetector array; depositing a metal layer over the substrate, conforming to the tapered opening, wherein a top of the metal layer is depressed at the tapered opening; patterning the metal layer to form a backside ground (BSGD) structure surrounding the photodetector array in the tapered opening; and patterning the metal layer to form a grid structure extending in another closed path around the photodetector array, wherein the BSGD surrounds the grid structure.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
forming an array of photodetectors within a substrate;
forming a transistor on a first side of the substrate;
etching a tapered opening into a second side of the substrate, opposite the first side, wherein the tapered opening extends in a closed path along a periphery of the array of photodetectors to surround the array of photodetectors;
depositing a metal layer over the substrate, conforming to the tapered opening, wherein a top of the metal layer is depressed at the tapered opening, and wherein sidewalls and a lower surface of the metal layer within the tapered opening contact the substrate;
patterning the metal layer to form a backside ground (BSGD) structure surrounding the array of photodetectors in the tapered opening; and
patterning the metal layer to form a grid structure extending in another closed path around the array of photodetectors, wherein the BSGD structure surrounds the grid structure.

2. The method of claim 1, wherein the tapered opening is etched using a combination of trifluoromethane and carbon tetrafluoride.

3. The method of claim 2, wherein the tapered opening is etched using a single step etching process.

4. The method of claim 1, further comprising:
forming a first barrier layer over the substrate before etching the tapered opening, wherein the grid structure is separated from the substrate by the first barrier layer, and wherein the BSGD structure directly contacts the substrate.

5. The method of claim 1, further comprising forming color filters and micro-lenses overlying the array of photodetectors on the second side of the substrate.

6. A method of forming an integrated device, comprising:
forming a photodetector between a first side of a substrate and a second side of the substrate that is opposite to the first side;
etching a tapered opening into the second side of the substrate using a dry etch comprising a combination of trifluoromethane and carbon tetrafluoride, wherein the tapered opening surrounds the photodetector, and wherein the dry etch exposes a recessed surface of the substrate between the first side and the second side;

depositing a metal layer onto the substrate over the photodetector and the tapered opening, the metal layer having both a lowermost surface between the first side and the second side and sidewalls contacting the substrate; and patterning the metal layer to form a metal grid surrounding the photodetector and a backside ground (BSGD) structure surrounding the metal grid, wherein the BSGD structure extends into the tapered opening.

7. The method of claim 6, wherein while etching the tapered opening, a ratio of carbon to fluorine is tuned during the etch.

8. The method of claim 7, wherein the ratio of carbon to fluorine is increased during the etching of the tapered opening.

9. The method of claim 6, wherein the etching of the tapered opening further comprises depositing a polymer layer on newly exposed sidewalls of the substrate throughout the etching.

10. The method of claim 6, further comprising forming a first conductive pad within the substrate before etching the tapered opening, wherein after patterning the metal layer to form the metal grid and the BSGD structure, the first conductive pad is electrically coupled to the metal grid and the BSGD structure.

11. The method of claim 6, further comprising:

etching a second tapered opening into the substrate concurrent with etching the tapered opening, wherein the second tapered opening surrounds the photodetector and the tapered opening surrounds the second tapered opening, and wherein the BSGD further extends into the second tapered opening.

12. The method of claim 6, wherein patterning of the metal layer further results in a plurality of conductive lines extending from the metal grid to the BSGD structure.

13. The method of claim 6, wherein the metal grid is electrically isolated from the BSGD structure.

14. A method of forming an integrated device, comprising:

forming a photodetector within a substrate;

forming a barrier layer on a side of the substrate and having a first surface facing away from the substrate;

etching a first tapered opening through the barrier layer and into the substrate, wherein the first tapered opening is bounded by a recessed surface of the substrate spaced from the side of the substrate and a sidewall extending from the recessed surface to the first surface of the barrier layer, wherein the sidewall is at a first obtuse angle to the recessed surface;

depositing a metal layer onto the substrate over the photodetector and the first tapered opening, wherein the metal layer has a recessed surface overlying the first tapered opening and a sidewall that is at a second obtuse angle to the recessed surface, wherein the second obtuse angle is substantially the same or greater than the first obtuse angle; and patterning the metal layer to form a metal grid surrounding the photodetector and a backside ground (BSGD) structure surrounding the metal grid, wherein the BSGD structure extends into the first tapered opening.

15. The method of claim 14, wherein a majority of the sidewall bounding the first tapered opening is level with the barrier layer.

16. The method of claim 14, further comprising:

etching a second tapered opening into the substrate concurrent with etching the first tapered opening, wherein the second tapered opening surrounds the photodetector and the first tapered opening surrounds the second tapered opening, and wherein the BSGD further extends into the second tapered opening.

17. The method of claim 16, wherein etching the second tapered opening results in a ridge extending between the first tapered opening and the second tapered opening, and wherein the ridge comprises a closed ring of the barrier layer that is isolated from other portions of the barrier layer by the first tapered opening and the second tapered opening.

18. The method of claim 14, wherein the first obtuse angle is substantially equal to or greater than 110 degrees.

19. The method of claim 14, wherein the first tapered opening is etched into the substrate using a dry etch with an etchant comprising a combination of trifluoromethane and carbon tetrafluoride.

20. The method of claim 19, wherein a ratio of carbon to fluorine within the etchant is changed during the dry etch.

* * * * *